United States Patent
Ulinskas

(10) Patent No.: US 7,940,051 B2
(45) Date of Patent: May 10, 2011

(54) METHOD FOR TESTING CIRCUIT BREAKERS

(76) Inventor: Algerd M. Ulinskas, Torrington, CT (US)

( * ) Notice: Subject to any disclaimer, the term of this patent is extended or adjusted under 35 U.S.C. 154(b) by 507 days.

(21) Appl. No.: 12/076,962

(22) Filed: Mar. 26, 2008

(65) Prior Publication Data

US 2009/0243620 A1    Oct. 1, 2009

(51) Int. Cl.
*G01R 31/327* (2006.01)
(52) U.S. Cl. .......................................... 324/424
(58) Field of Classification Search ............ 324/424
See application file for complete search history.

(56) References Cited

U.S. PATENT DOCUMENTS

| 4,814,712 A | * | 3/1989 | Burton et al. ............... 324/424 |
| 5,272,438 A | * | 12/1993 | Stumme ....................... 324/424 |

* cited by examiner

*Primary Examiner* — Amy He

(57) ABSTRACT

A method for testing low voltage power circuit breakers having an electronic trip unit which includes a display and a microprocessor for controlling various protective functions and storing settings for such functions which can be selected and performed. Entering into the test mode disables functions not necessary for the testing to be performed. A current is injected into one of the phases of the breaker. The technician observes whether the breaker performs within the specifications for the selected protective function. Upon exiting the test mode, the breaker is automatically restored to the settings prior to the testing.

8 Claims, 4 Drawing Sheets

METHOD FOR TESTING CIRCUIT BREAKERS

BACKGROUND OF THE INVENTION

The present invention relates to the testing of low voltage power circuit breakers.

The basic design of the low voltage power circuit breaker has been utilized in virtually all large industrial facilities since the 1930's. The circuit breakers of that vintage and those manufactured up to the late 1960's exclusively utilized electromechanical overloads which sensed current and provided a time delay in the case of an over-current or fault. Later versions utilized electronic controls, first solid state and then microprocessor-based.

As used herein, the term "electronic trip unit" means any version of electronic trip devices, either solid state or microprocessor controlled, which can be used to assist in the testing. The electronic trip unit controls afford many advantages, including more versatility in settings and the ability to trip the breaker due to ground faults. Moreover, some microprocessor-controlled trip units offer advanced features such as communications and logging of trip counts and trip data.

Due to the critical applications in which circuit breakers may be used, they are always tested prior to being placed into service and during scheduled preventive maintenance intervals. These tests are designed to verify the functionality of the breaker's mechanical components and of the electronic trip unit.

Standard industry practice is to use one of two basic testing methods to verify the operation of the breaker and electronic trip unit. Both of these test methods are typically performed on a single phase and are repeated for each of the three breaker phases. Primary injection involves passing a low voltage, high current test signal through the primary winding of the current sensor which is interfaced directly to the electronic trip unit. Secondary injection testing involves injecting a low voltage, low current directly into the electronic trip unit.

In order to test a breaker using the current technology, the test technician is faced with several obstacles. These include:

1. It is not possible to test certain functions without disabling others. An example of a function that can not be tested is the instantaneous pickup point. Often, a trip device is programmed with two protection bands which are designed to protect against short circuits. One band is commonly known as the "short-time protection band". This band provides a programmable delay of 0.07 to 0.500 seconds before tripping the breaker after a preset current threshold is exceeded. The other band is commonly known as "instantaneous protection" and trips a breaker immediately if a current threshold is exceeded. Typically, the short-time threshold or "pickup point" is set lower than the instantaneous pickup point. These pickup points are tested by slowly ramping up a test current and verifying that the unit under test trips when the current is between preset tolerance limits. Testing the instantaneous pickup with short-time protection is not possible because the electronic trip unit will trip the breaker based on the short-time setting before the instantaneous pickup-point is reached.
2. Low voltage power circuit breakers are typically tested by injecting a single phase of current, either through the sensor primary or directly into the electronic trip unit. By definition, protection elements such as ground fault and phase imbalance will cause a breaker to trip when it senses a single phase. This prohibits other functions from being tested.

Prior to this invention, two options were available to temporarily disable these functions. First, settings could be manually disabled by use of the setup controls on the electronic trip unit. This task is tedious, time consuming and susceptible to human error in that these settings must be correctly re-set before the breaker is returned to service. Second, a hardware device known as a "ground defeat cable" can be used to allow testing on a breaker that has an electronic trip unit with ground fault protection. The ground defeat cable is inserted between the electronic trip unit and the breaker-mounted current sensors. A disadvantage in using a ground defeat cable is that the breaker wiring harness must be disconnected from the electronic trip unit. Often, due to space limitations, it is very difficult to access this connector and some disassembly can be required. More seriously, when the ground defeat cable is removed and the breaker is readied to be returned to service, the current sensor must be properly re-connected to the electronic trip unit. Because of space limitations, it is often difficult to properly connect this cable or to verify the integrity of the connection. If an improper electrical connection between the current sensors and the electronic trip unit is made, the current sensors will be "open circuited" upon re-energization. Open circuited current sensors generate a high voltage which can be dangerous to personnel and can damage wiring, the electronic trip unit and the current sensors themselves.

3. Because interrupting by a high current fault has adverse effects on the service life of the breaker as well as the primary injection test set, breakers are often tested with settings temporarily lowered. With present technology, the test technician must manually adjust the settings on the electronic trip unit. If changes are made to the electronic trip unit settings, there is a possibility that these settings will not be properly restored prior to the breaker's being returned to service.
4. Because the menu systems in all presently available trip units are designed for ease of initial setup, not for temporarily changing settings or disabling functions, the test technician is required to scroll through a complete setup routine to make these temporary changes. This process is both time consuming and prone to human error due to the fact that the technician may incorrectly restore the original settings or omit performing this task altogether.
5. Some microprocessor based trip units have features that log the details of trips and/or count the number of trips that have occurred. It is not desirable to log trip events that occur during testing. Using present technology, the operator is forced to either clear the entire trip history or to retain the trips that were logged during a test sequence.
6. Some microprocessor based trip units have auxiliary outputs that communicate information such as the status of alarm contacts or tripping restraint signals to other electronic trip units or to outside systems. These features are typically used in control or automation or zone-interlocking schemes. Because these status indicators become active only when specific conditions occur and by definition involve interaction between multiple trip units or between trip units and outside systems, testing using existing methods is difficult and time consuming.

Power circuit breakers are often used in applications where they are required to continually be in service. Examples of these applications include data centers, hospitals and airports. Opportunities to perform maintenance and testing are rare and the durations of scheduled outages are limited.

Since minimizing the duration of an outage is critical, test technicians are required to work long shifts with minimal breaks. Often, several hours of preparation precede the beginning of an outage. The possibility of human error in these instances is high due to the stress and fatigue.

Accordingly, it is an object of the present invention to provide a novel method for testing low voltage power circuit breakers.

It is also an object to provide such a method which lessens the time required for the testing of a circuit breaker.

Another object is to provide such a method which precludes inadvertent resetting of the breaker at other than the original settings before testing.

SUMMARY OF THE INVENTION

It is now been found that the foregoing and related objects may be readily attained in a method for testing low voltage power circuit breakers having an electronic trip unit including one or more microprocessors for controlling various protective functions and storing settings for such functions which can be selected and performed. The trip unit should also include a display and enable selection of the functions. The trip unit is provided with a test mode which disables trip logging, trip counting, ground fault detection and other functions not necessary for the testing to be performed. The test mode operation may involve adding the test functions to the microprocessor resident in the trip unit or by coupling a separate module to the microprocessor resident in the trip unit.

The technician actuates at least one of the protective functions selected from the group consisting of long time, short time, instantaneous, ground fault and phase imbalance. The test mode may also allow the technician to toggle the status of various auxiliary outputs to test a control, zone interlock or automation system.

A current is injected into one of the phases of the breaker and trip unit, and the technician observes whether the breaker performs within specifications for the selected protective function. After testing has been completed, the technician exits the test mode and this automatically resets the breaker to the settings prior to the testing. Desirably, each phase is tested.

When the testing is primary, the injected current directed to the current sensor of the breaker is of high amperage and low voltage. When the testing is secondary, the injected current is of low amperage and low voltage.

If, when in test mode, no actions are taken for a predetermined period of time, the test mode is exited automatically and the breaker is returned to service with the original settings. However, the technician may make temporary changes on the trip unit to settings during testing and those changes are stricken upon exiting from the test mode.

DETAILED DESCRIPTION OF THE PREFERRED EMBODIMENTS

Figure 1:
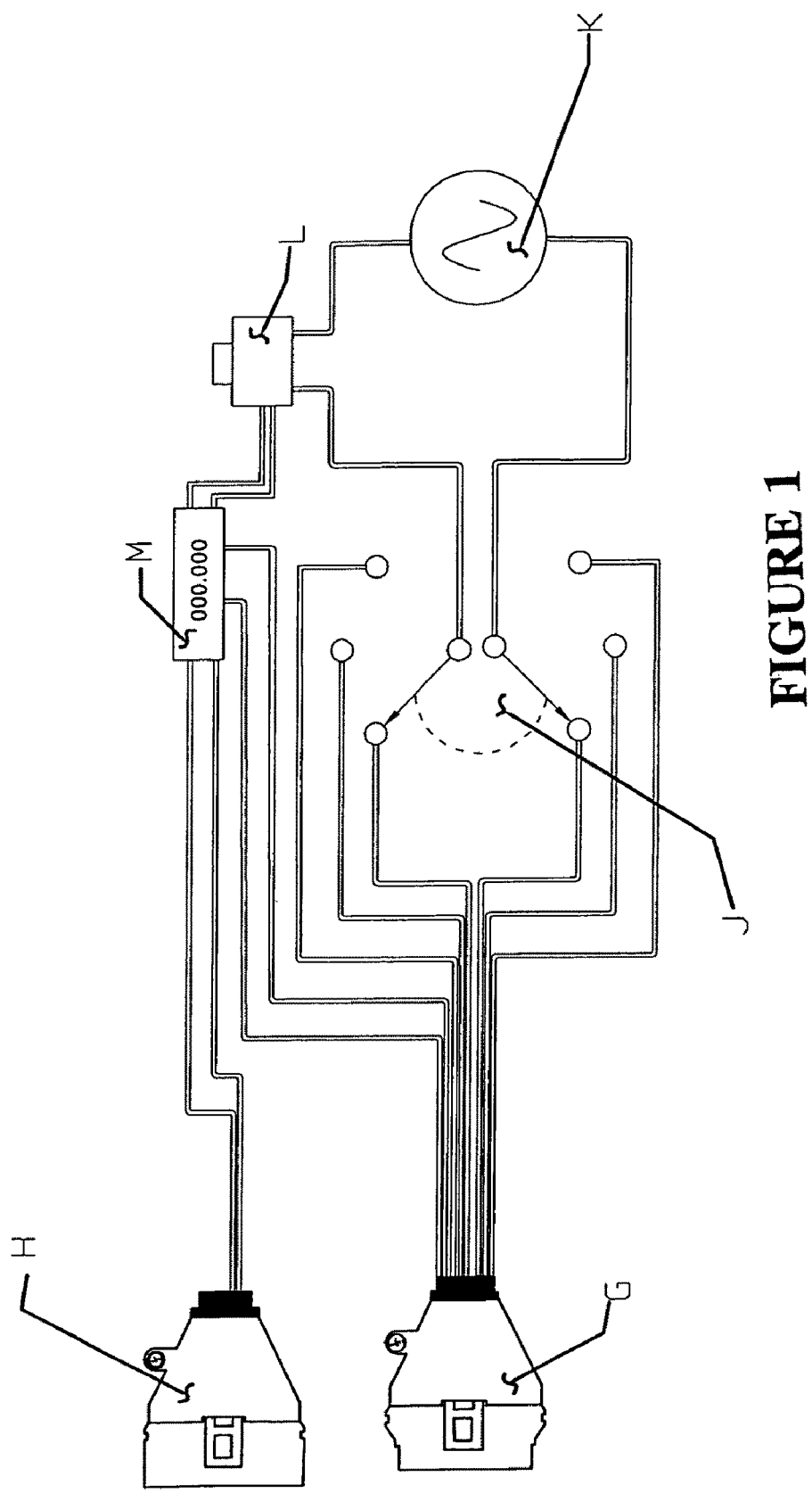
FIG. 1 is a diagrammatic illustration of a low voltage breaker with an electronic trip unit.

Diagrammatically illustrated in FIG. 1, is a low voltage power circuit breaker of the type having an electronic trip unit E. For practicing the method of the present invention, the electronic trip unit E has a "test mode" provided either in its microprocessor or in a separate module coupled thereto. The main components of a circuit breaker include three current sensors A that provide output (secondary) current that is proportional to the current in the bus that is being monitored. This current is typically stepped down to levels between 0.004% to 2.0% of the bus current, and copper details B route the bus current through the current sensors. A wire harness C connects the secondaries of the current sensors and the flux shift device N to a connector D that can be plugged into a mating receptacle F on the electronic trip unit E. A flux shift device N converts an electronic trip signal generated by the electronic trip device E to mechanical energy to open or trip the circuit breaker.

When configured for secondary testing, the breaker harness C is removed from the electronic trip unit E and plugged into the mating receptacle H of the secondary test set. The connector G from the secondary test set is plugged into the mating receptacle F on the electronic trip unit.

Figure 2:
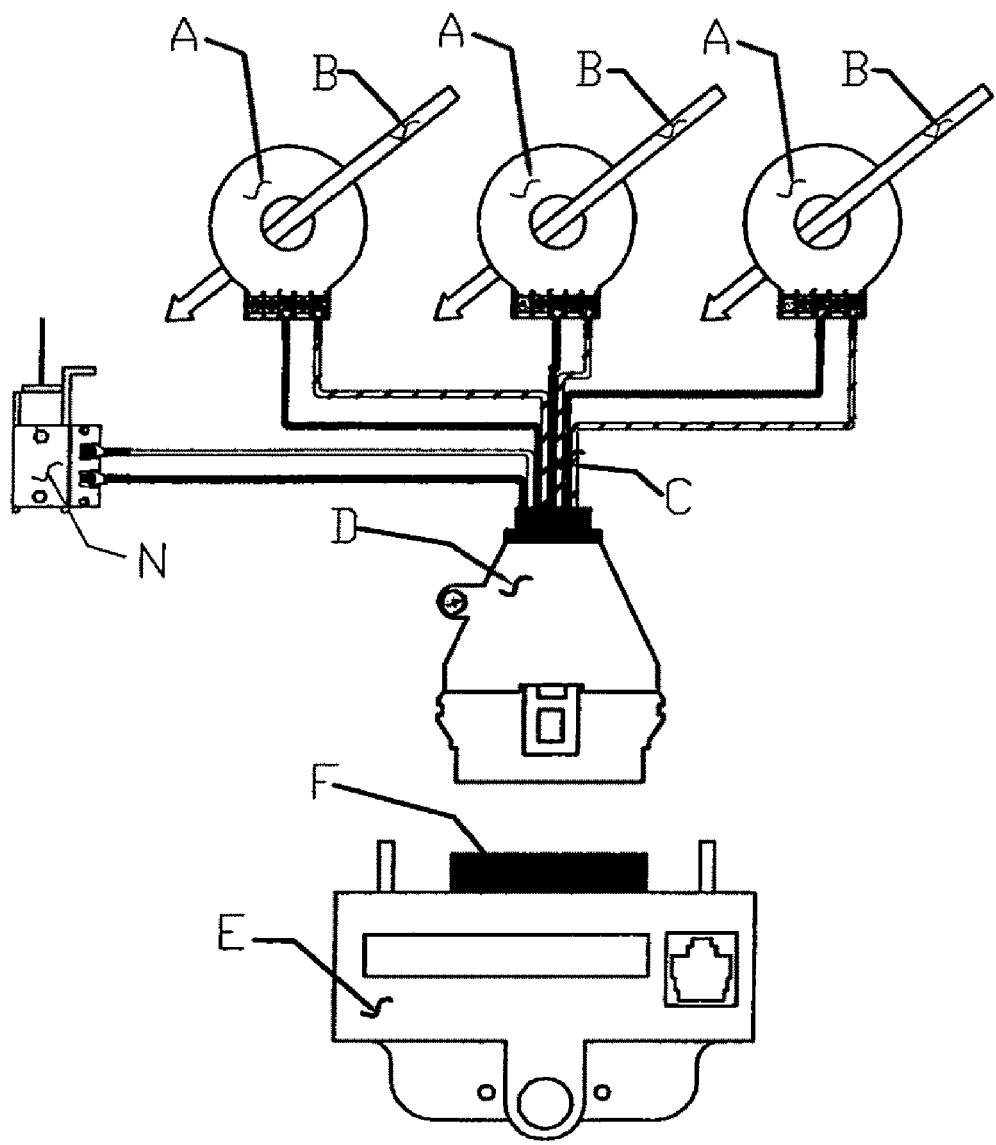
FIG. 2 is a diagrammatic illustration of a secondary injection test set.

As seen in FIG. 2, the main components of a secondary injection test set include a single-phase, variable current source K which is capable of generating a current equal to the maximum current expected to be produced on the secondary side of the phase current sensors A. An electronic switch module L simultaneously initiates an output from the current source K and starts an electronic timing module M. A phase selector switch J directs a test current produced by one of the phase inputs of the electronic trip unit E, and a connector G mates with connector F on the electronic trip unit E. The timing module M begins timing when the switch module L is actuated and stops timing when it senses a trip signal from the electronic trip unit E. The timing module M also passes the trip signal to connector H which is ultimately connected to the flux shift device N.

As is conventional to identify the several functions, L is long time, S is short time, I is instantaneous. "G" is ground fault, "quit" is to stop the Test Mode. The trip unit may also access other, less commonly used functions.

In practicing the method of the present invention, the technician removes the breaker harness from the trip unit and plugs it into the receptacle H of the test set.

The technician enters the Test Mode by pressing a key on the display panel of the trip unit. The Test Mode may also be accessed through a communications port. Upon entering the Test Mode, the microprocessor automatically disables trip logging and other functions that may interfere with testing, such as thermal memory.

The user is given options to toggle on or off any protective functions that may interfere with the test. These functions can include, but are not limited to Short-Time, Instantaneous, Ground Fault and Phase Imbalance. While in Test Mode, the trip unit can be tested by single phase primary or secondary injection.

The trip device constantly monitors for conditions that indicate that the Test Mode should be exited. These conditions include: (a) the expiration of a pre-determined time period with no "keystroke" entries by the test technician, (b) manual entry through the trip unit's front panel or through a communications interface, and (c) sensing that the breaker has been returned to service. If none of these conditions occurs, the unit will remain in Test Mode. When the trip unit exits, the test mode and all settings are automatically restored to the values that were in effect prior to entering the Test Mode.

Figure 3:
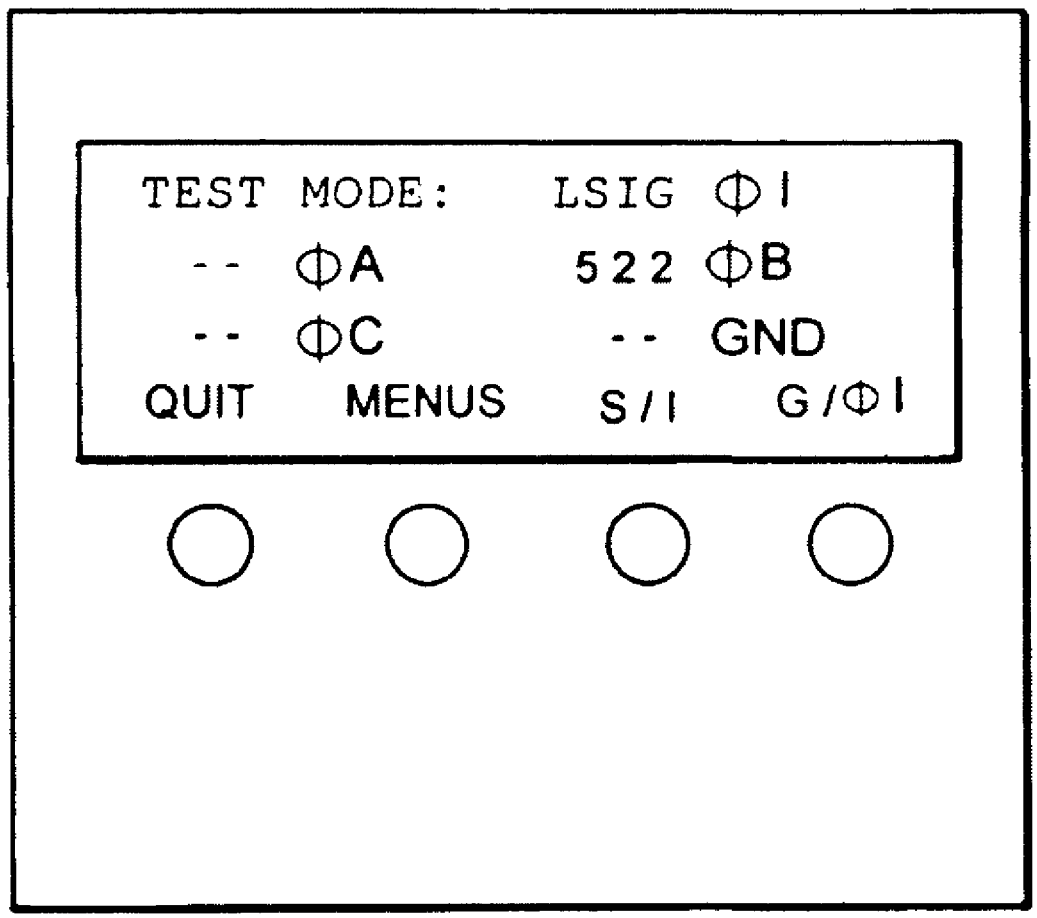
FIG. 3 is an illustration of the display in the trip unit of the breaker showing the functional options and of the actuating buttons therebelow.
Figure 4:
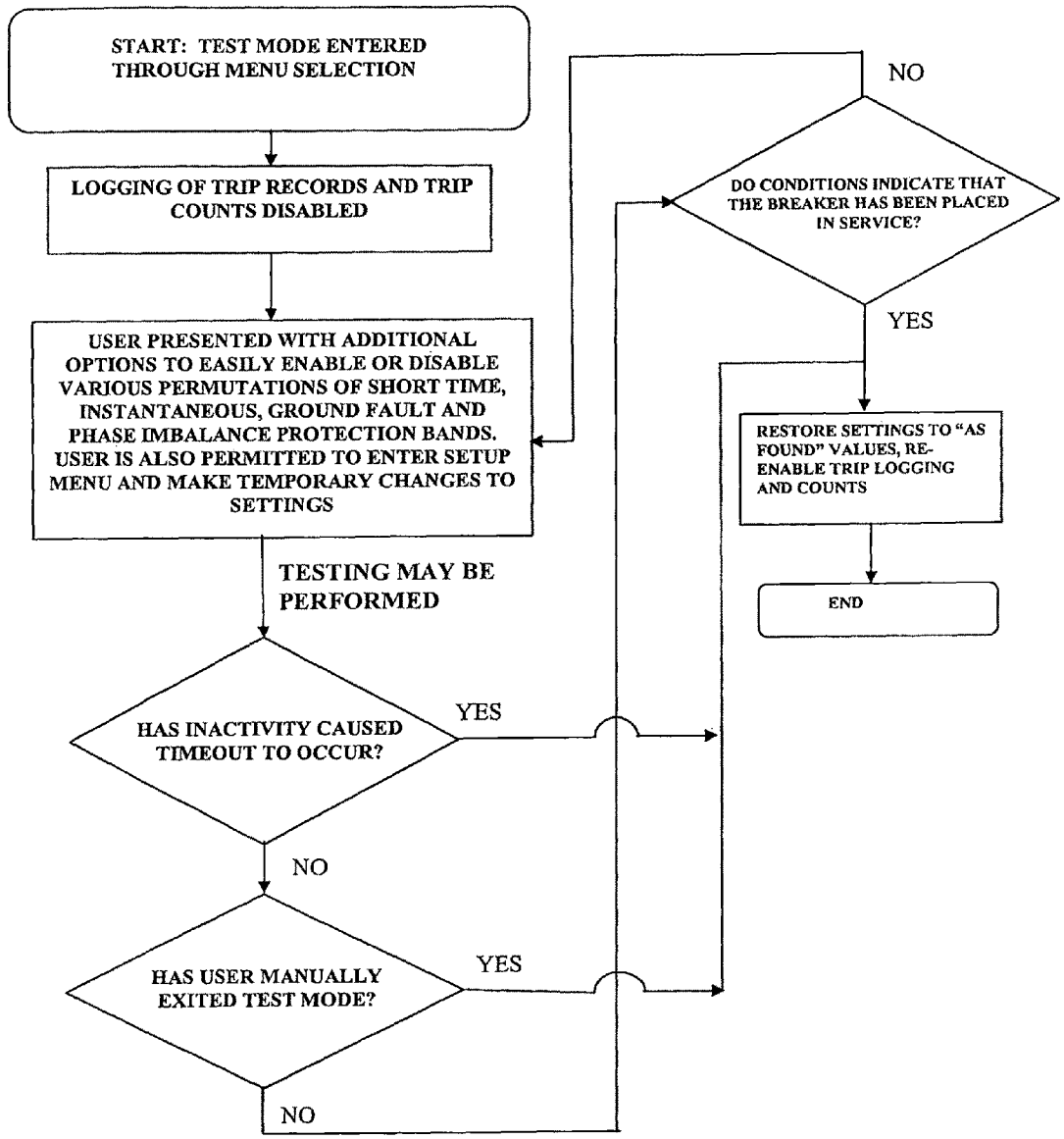
FIG. 4 is a block diagram of the testing method of the present invention.

As seen in FIG. 3, the trip device has a display panel DP with the several functions appearing thereon and operating buttons OB to actuate or terminate the function being tested. As previously indicated, the technician activates the Test Mode and selects an option(s) shown on the display, such as disabling ground fault and enabling short time protection band. Current is injected from the primary test set and the technician can note the time to trip as being in accord with specifications. This can be done for other functions of interest and thereafter for the other current phases.

If at any time during the test protocol, the microprocessor finds that there has been no action for some selected period of time or that the technician has exited the Test Mode, the microprocessor will assume that the breaker has been placed in service and the settings will be reset, i.e., returned to their position prior to entering the Test Mode. The trip unit assumes that the breaker has been placed in service if it detects more than 1 phase of current or both 1 phase of current and neutral current.

The operating settings for the breaker can be changed while in the Test Mode, but the changes are only temporary.

The instructions for the Test Mode may be provided in the microprocessor of the trip unit or in a separate module cooperating therewith. To facilitate the test procedure, the display, keys and separate module, may be coupled to the trip unit by a cable, thus allowing the technician to position it where it can be viewed and easily operated.

Thus, it can be seen from the attached drawings and the detailed specification that the test method of present invention provides a novel and expeditious procedure for testing circuit breakers and their trip units. The procedure is safe and reliable and substantially protects against inadvertent change in the normal settings.

Having thus described the invention, what is claimed is:

1. In a method for testing low voltage power circuit breakers, the steps comprising:
   (a) providing a low voltage circuit breaker with an electronic trip unit including a microprocessor for controlling various protective functions and storing settings for such functions which can be selected and performed, said trip unit including a display;
   (b) entering a test mode in which the microprocessor automatically disables trip logging, trip counting, ground fault detection and other functions not necessary for the testing to be performed;
   (c) actuating at least one of the protective functions selected from the group consisting of long time, short time, instantaneous, ground fault and phase imbalance;
   (d) injecting into one of the phases of said breaker and trip unit a current and observing whether the breaker performs within specifications for the selected protective function; and
   (e) exiting the test mode with the microprocessor automatically resetting the breaker to the settings prior to the testing.

2. In a method for the testing of low voltage circuit breakers in accordance with claim 1 wherein each phase is tested.

3. In a method for the testing of low voltage circuit breakers in accordance with claim 1 wherein the testing is primary and wherein injected current directed to the current sensor of the breaker is of high amperage and low voltage.

4. In a method for the testing of low voltage circuit breakers in accordance with claim 1 wherein the testing is secondary and wherein the injected current is of low amperage and low voltage.

5. In a method for the testing of low voltage circuit breakers in accordance with claim 1 wherein the test mode may be exited and wherein the breaker and trip unit settings automatically return to the setup prior to the testing.

6. In a method for the testing of low voltage circuit breakers in accordance with claim 5 wherein, if no actions are taken for a predetermined period of time, the test mode is exited automatically and the breaker is returned to service with the original settings.

7. In a method for the testing of low voltage circuit breakers in accordance with claim 1 wherein included there is a step of making the temporary changes to the breaker settings during testing and said changes are deleted upon exiting of test mode.

8. In a method for testing low voltage power circuit breakers, the steps comprising:
   (a) providing a low voltage circuit breaker with an electronic trip unit including a microprocessor for controlling various protective functions and storing settings for such functions which can be selected and performed, said trip unit including a display;
   (b) entering a test mode which disables trip logging, trip counting, ground fault detection and other functions not necessary for the testing to be performed;
   (c) actuating at least one of the protective functions selected from the group consisting of long time, short time, instantaneous, ground fault and phase imbalance;
   (d) injecting into one of the phases of said breaker and trip unit a current and observing whether the breaker performs within specifications for the selected protective function;
   (e) exiting the test mode and resetting the breaker to the settings prior to the testing; and)
   (f) wherein, the test mode is exited, said breaker and trip unit settings are automatically returned to the settings prior to the testing.

* * * * *